United States Patent
Horning et al.

(10) Patent No.: US 8,018,229 B1
(45) Date of Patent: Sep. 13, 2011

(54) STRUCTURE AND METHOD FOR FLEX CIRCUIT ON A CHIP

(75) Inventors: Robert D. Horning, Savage, MN (US); Jeff A. Ridley, Shorewood, MN (US); Bharat Pant, Minneapolis, MN (US)

(73) Assignee: Honeywell International Inc., Morristown, NJ (US)

( * ) Notice: Subject to any disclaimer, the term of this patent is extended or adjusted under 35 U.S.C. 154(b) by 14 days.

(21) Appl. No.: 12/765,040

(22) Filed: Apr. 22, 2010

(51) Int. Cl.
*G01R 33/02* (2006.01)

(52) U.S. Cl. ........................................ 324/252; 324/247

(58) Field of Classification Search .................. None
See application file for complete search history.

(56) References Cited

U.S. PATENT DOCUMENTS

| | | | |
|---|---|---|---|
| 5,161,009 A | 11/1992 | Tanoi et al. | |
| 6,392,220 B1 | 5/2002 | Slater et al. | |
| 6,951,143 B1 | 10/2005 | Adderton et al. | |
| 7,296,363 B2 | 11/2007 | Danisch et al. | |
| 7,498,802 B2 * | 3/2009 | Takahata | 324/207.15 |
| 7,942,072 B2 * | 5/2011 | Chang et al. | 73/862.044 |
| 2002/0139981 A1 | 10/2002 | Young | |
| 2008/0007253 A1 | 1/2008 | Takahata | |

FOREIGN PATENT DOCUMENTS

WO 9523342 8/1995

* cited by examiner

*Primary Examiner* — Minh N Tang
(74) *Attorney, Agent, or Firm* — Fogg & Powers LLC

(57) ABSTRACT

A method of fabricating a multi-axis sensor is provided. The method includes forming patterns of sacrificial material overlaying a substrate and overlaying a flexible material on the sacrificial material and an anchor-surface of the substrate. The flexible material includes sensor-regions, an anchor-region, and at least one hinge-region. The method further includes forming sensor elements from orientable sensor material overlaying respective sensor-regions of the flexible material; forming at least one respective anchor-hinge in the flexible material along the boundary between the anchor-region and an adjacent sensor region; forming the sensor-regions, the anchor-region, and the at least one hinge-region in the flexible material; training the sensor elements to form respective oriented-sensor elements that are oriented in the same direction; etching the sacrificial material; and etching the substrate at an angle from the anchor-surface.

20 Claims, 12 Drawing Sheets

STRUCTURE AND METHOD FOR FLEX CIRCUIT ON A CHIP

BACKGROUND

Multi-axis sensors having three different preferred axes are currently manufactured by making three separate single-axis devices, which are mounted orthogonally on a carrier, such as a board or a block. It would be preferable to make all three axes simultaneously on a single chip, thus avoiding the time and cost of packaging and mounting three individual devices. Unfortunately it is often difficult, and sometimes impossible, to make a device-on-a-chip with three sensors having axes oriented in three orthogonal directions. For example, a magnetic sensor must be "trained" to orient its sensitive axis along a selected direction. Such "training" is done by annealing a wafer in the presence of an externally-applied magnetic field. The sensors are then diced and the individual sensors are orthogonally arranged on a carrier during an expensive and time-consuming process. During the training step, the external magnetic field is essentially the same over the whole wafer. Therefore one sensor on the wafer cannot be trained with one orientation while another sensor next to it is trained with a different orientation.

SUMMARY

The present application relates to a method of fabricating a multi-axis sensor. The method includes forming patterns of sacrificial material overlaying a substrate and overlaying a flexible material on the sacrificial material and an anchor-surface of the substrate. The flexible material includes sensor-regions, an anchor-region, and at least one hinge-region. The method further includes forming sensor elements from orientable sensor material overlaying respective sensor-regions of the flexible material; forming at least one respective anchor-hinge in the flexible material along the boundary between the anchor-region and an adjacent sensor region; forming the sensor-regions, the anchor-region, and the at least one hinge-region in the flexible material; training the sensor elements to form respective oriented-sensor elements that are oriented in the same direction; etching the sacrificial material; and etching the substrate at an angle from the anchor-surface.

DRAWINGS

In accordance with common practice, the various described features are not drawn to scale but are drawn to emphasize features relevant to the present invention. Like reference characters denote like elements throughout figures and text.

DETAILED DESCRIPTION

Figure 1A:
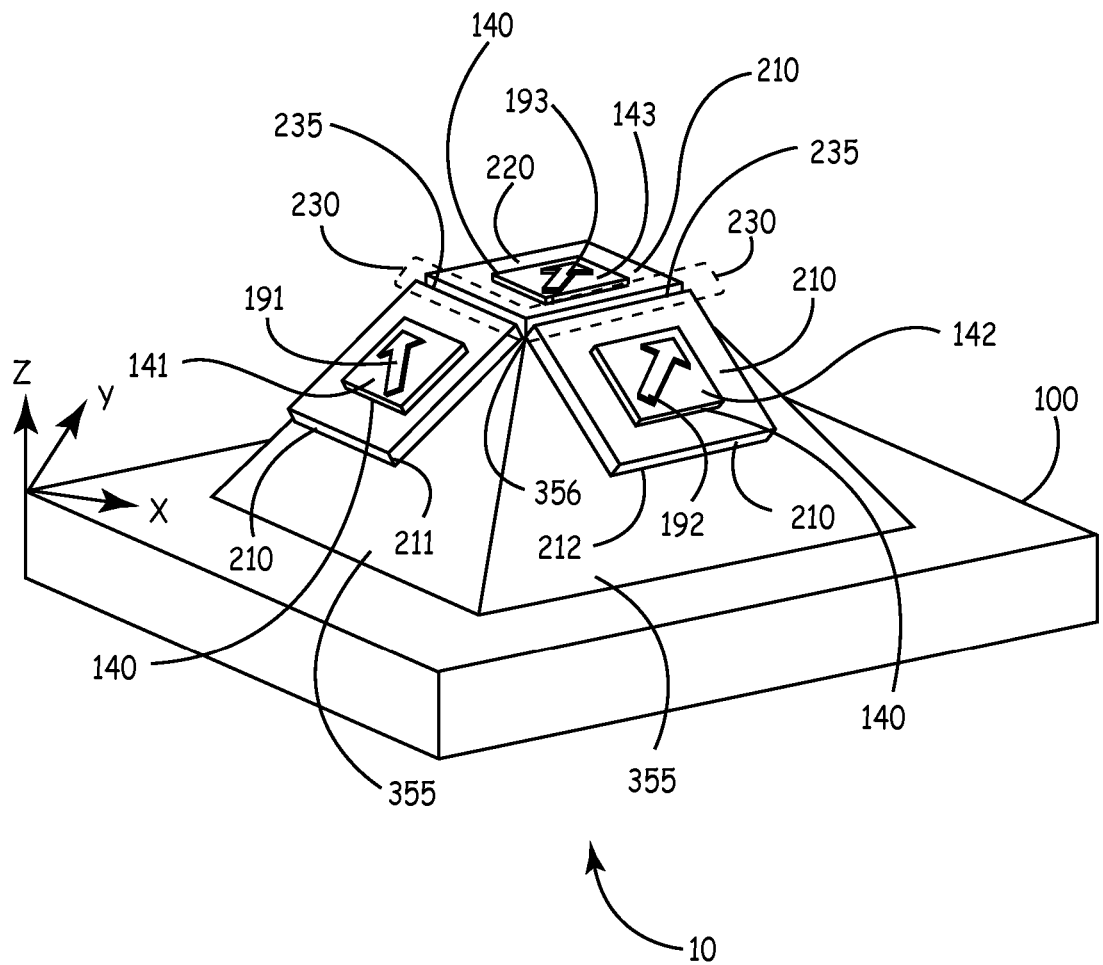
FIGS. 1A-1C show an embodiment of a multi-axis sensor in accordance with the present invention.

Many types of sensors have a preferred orientation or axis. Often, that preferred axis is a key feature of the sensor. Examples of sensors requiring an orientation include gyroscopes, accelerometers, and magnetometers. A gyroscope measures the rotation rate around an axis; accelerometers measure linear acceleration along an axis; magnetometers measure the magnetic field strength in a given direction. Practical devices often use multiple sensors in different orientations. For example, inertial measurement units use three orthogonally-oriented gyros and three orthogonally-oriented accelerometers to fully characterize motion in three dimensional space. Image stabilization sensors use accelerometers and gyros to measure vibration and rotation of cameras. Skid-control sensors use combinations of gyros to measure rotation and correct for skids and slips in automobiles. Three orthogonal magnetometers can completely characterize a local magnetic field.

Embodiments of methods of fabricating the multi-axis sensors are described herein for a magneto resistive sensor (e.g., anisotropic magnetoresistive (AMR) sensor, giant magnetoresistive (GMR) sensor, or tunneling magnetoresistive (TMR) sensor) having three orthogonally-orientated sensor elements. The methods of fabricating the multi-axis sensors can be applied to other types of sensors, including but not limited to, directionally-sensitive magnetometers based on other physical principles, gyroscopes, accelerometers, airflow sensors and other directional sensors.

The multi-axis sensors described herein have at least two sensors oriented in a selected non-parallel orientation. The methods of fabricating the multi-axis sensors described herein allow fabricators to simultaneously train a plurality of sensor elements, which overlay a planar substrate, with a sense axis that is orientated in the same direction to form a plurality of oriented-sensor elements. Training is also referred to herein as sense-axis training. The fabricators then process the substrate and layers overlaying the substrate in order to orient one or more of the oriented-sensor elements with respect to each other as required for the desired operation of the multi-axis sensor. The other processing steps provide the desired angular alignment of the sense axes of the oriented-sensor elements for operation of the multi-axis sensor.

In some embodiments, multiple oriented-sensor elements are trained and many multi-axis sensors are fabricated with processing steps alone. In this case, the oriented-sensor elements are operably orientated by a folding-down process that is assisted by gravity.

In some embodiments, multiple oriented-sensor elements are trained and many multi-axis sensors are fabricated with processing steps and folding steps for each of the multi-axis sensors. In this case, the oriented-sensor elements are operably orientated by a folding-up process and a folding-down process. In one implementation of this embodiment, the folding-up process is assisted by air jets. In the embodiments described herein, the fabricator does not need to align a plurality of separated oriented-sensor elements using machines and/or aligning features on a carrier.

As defined herein, training (sense-axis training) is forming a sense axis for an oriented-sensor element or forming sense axes for a plurality of oriented-sensor elements. As defined herein, when two oriented-sensor elements are angularly oriented to each other, the sense axes of the oriented-sensor elements are at a selected angle to each other. As defined herein, when two oriented-sensor elements are orthogonally oriented to each other, the sense axes of the oriented-sensor elements are orthogonal to each other.

Figure 1B:
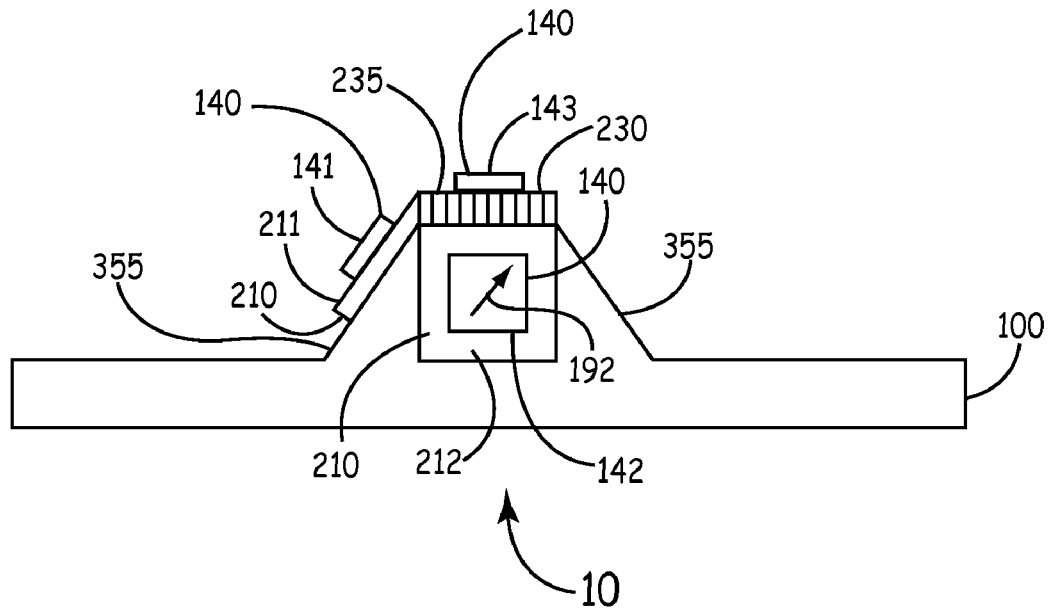
Figure 1C:
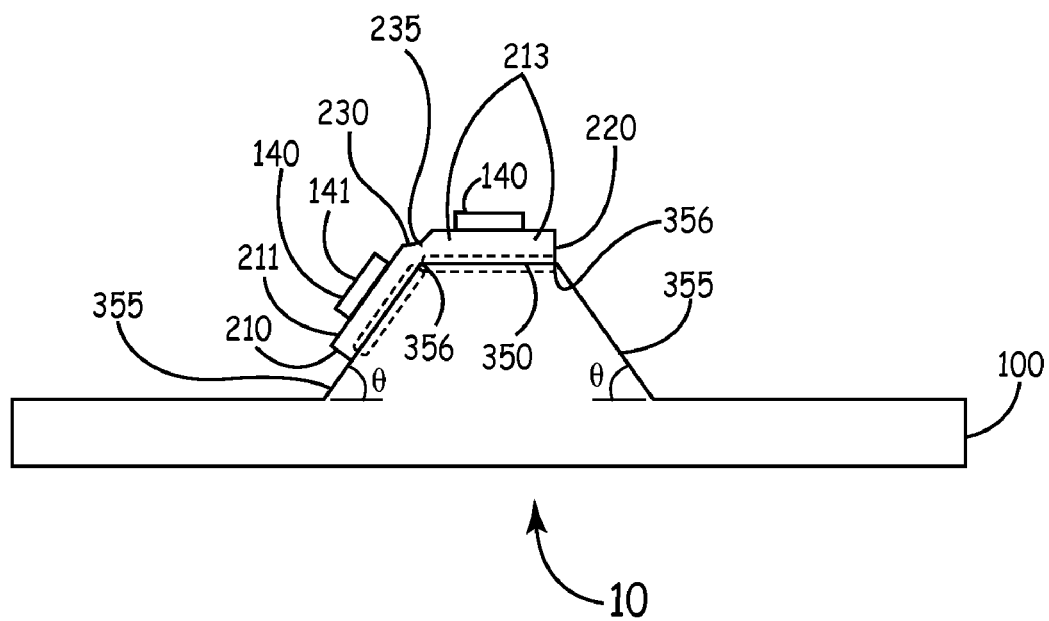

FIGS. 1A-1C show an embodiment of a multi-axis sensor 10 in accordance with the present invention. FIG. 1A shows an oblique view of the multi-axis sensor 10. FIG. 1B shows a front view of the multi-axis sensor 10. FIG. 1C shows a cross-sectional view of the multi-axis sensor 10.

The multi-axis sensor 10 includes a substrate 100 and an anchor-region represented generally at 220, sensor-regions 210, and hinge-regions represented generally at 230. The anchor-region 220, the sensor-regions 210, and the hinge-regions 230 are formed from a flexible material that overlays the substrate 100. In embodiments, a sensor is positioned on the anchor-region 220 so that anchor-region 220 is also a sensor region 210. The multi-axis sensor 10 also includes three oriented-sensor elements 141-143 that have three respective sensor axes 191-193 (represented by arrows) oriented in three different directions. The substrate 100 has at least one etched surface 355 and an anchor surface represented generally at 350 (FIG. 1C). The etched surfaces 355 of the substrate 100 share edges 356 with the anchor surface 350. As shown in FIG. 1, at least two etched surfaces 355 of the substrate 100 share edges 356 with the anchor surface 350.

The anchor-region 220 of flexible material is attached to the anchor surface 350. Hinges 235 are patterned and etched from the flexible material in the hinge region 230 along a boundary between the anchor-region 220 and an adjacent sensor region 210. The hinges 235 are formed to overlay the edges 356 and rotatably attach the anchor-region 220 to the sensor-regions 210. The sensor-regions 210 fold down onto the etched surfaces 355 of the substrate 100 so that the sensor-regions 210 have an angular orientation with the anchor region 220 and the anchor surface 350.

The sensor-regions 210 support the oriented-sensor elements 140. As shown in FIGS. 1A-1C, the sensor-regions 211-213 support the three oriented-sensor elements 141-143, respectively. Three oriented-sensor elements 141-143 have three respective sensor axes 191-193 oriented in three different directions.

The first oriented-sensor element 141 has a first sense axis 191 in a first direction. The first oriented-sensor element 141 overlays a first sensor-region 211 of the flexible material. The first sensor-region 211 of the flexible material overlays one of the etched surfaces 355.

The second oriented-sensor element 142 has a second sense axis 192 in a second direction. The second oriented-sensor element 142 overlays a second sensor-region 212 of the flexible material. The second sensor-region 212 of the flexible material overlays another one of the etched surfaces 355.

The third oriented-sensor element 143 has a third sense axis 193 in a third direction aligned with the Y axis. The third oriented-sensor element 143 overlays the anchor-region 220 of flexible material, which overlays the anchor surface 350. Since the two etched surfaces 355 are angularly oriented with respect to the anchor-surface 350, the first and second sensor-regions 211 and 212 are also angularly oriented with the anchor-region 220 and with each other. Likewise, the first oriented-sensor element 141 and the second oriented-sensor element 142 are also angularly oriented with the third oriented-sensor element 143 and with each other.

As shown in FIGS. 1A-1C, the first oriented-sensor element 141, the second oriented-sensor element 142 and the third oriented-sensor element 143 are not laying in orthogonal planes. Since the first sense axis 191, the second sense axis 192, and the third sense axis 193 are oriented in different directions, the first oriented-sensor element 141, the second oriented-sensor element 142 and the third oriented-sensor element 143 are operable to sense in three orthogonal directions. The electronic circuitry (not shown) communicatively coupled with the multi-axis sensor 10 de-convolves the output from the first oriented-sensor element 141, the second oriented-sensor element 142 along axes X and Z that are perpendicular to the Y axis. In this manner, the multi-axis sensor 10 is operable to sense in three orthogonal directions. Thus, the multi-axis sensor 10 senses a field or force in three orthogonal directions shown as X, Y, and Z in FIG. 1A.

In one implementation of this embodiment, the first, second, and third oriented-sensor elements 141, 142, 143 of the multi-axis sensor 10 are tunneling magneto resistive (TMR) sensor elements 141, 142, 143. In another implementation of this embodiment, the flexible material is a polyimide. In yet another implementation of this embodiment, sensor 10 includes two oriented-sensor elements.

Figure 2A:
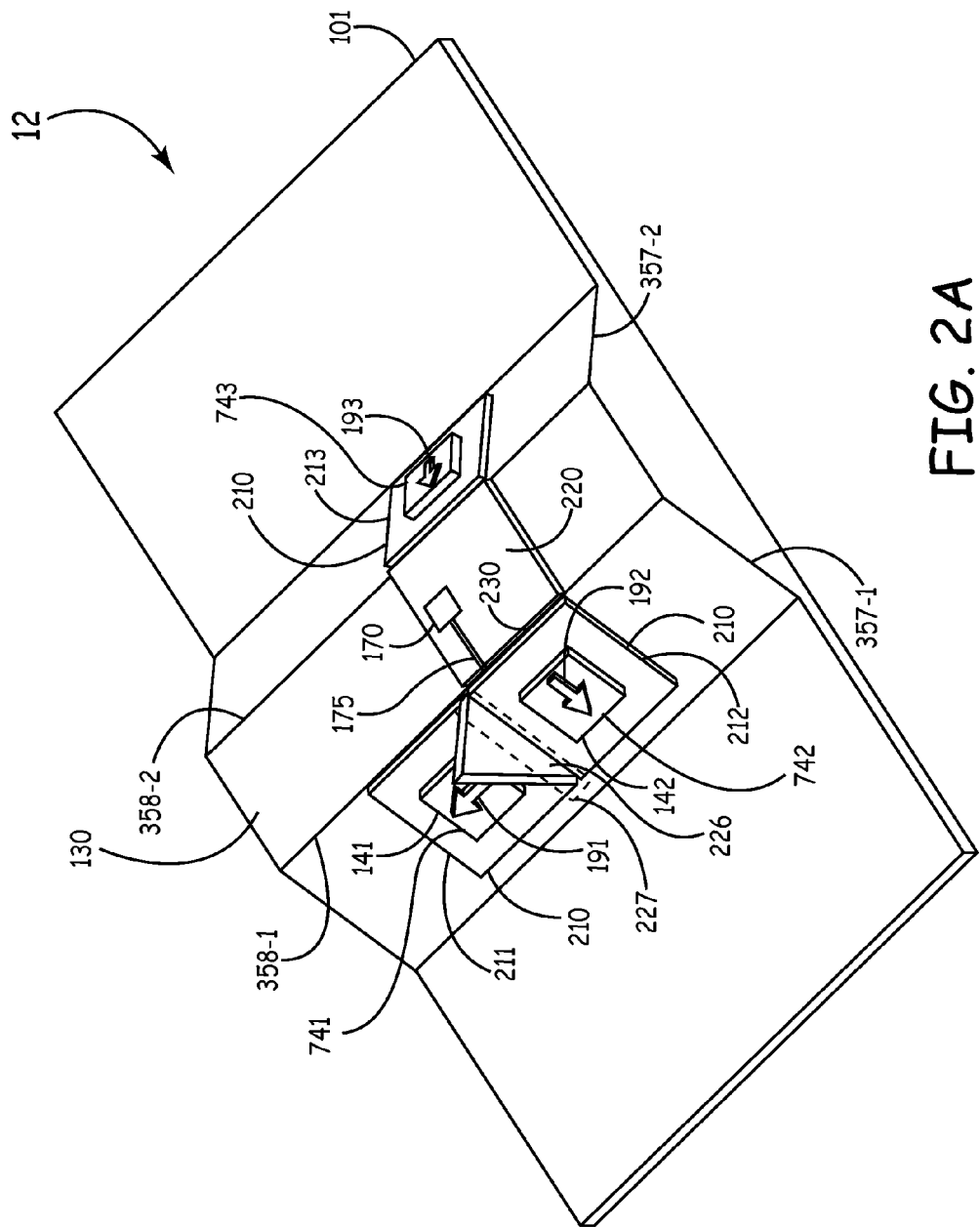
FIGS. 2A and 2B show an embodiment of a multi-axis sensor in accordance with the present invention.
Figure 2B:
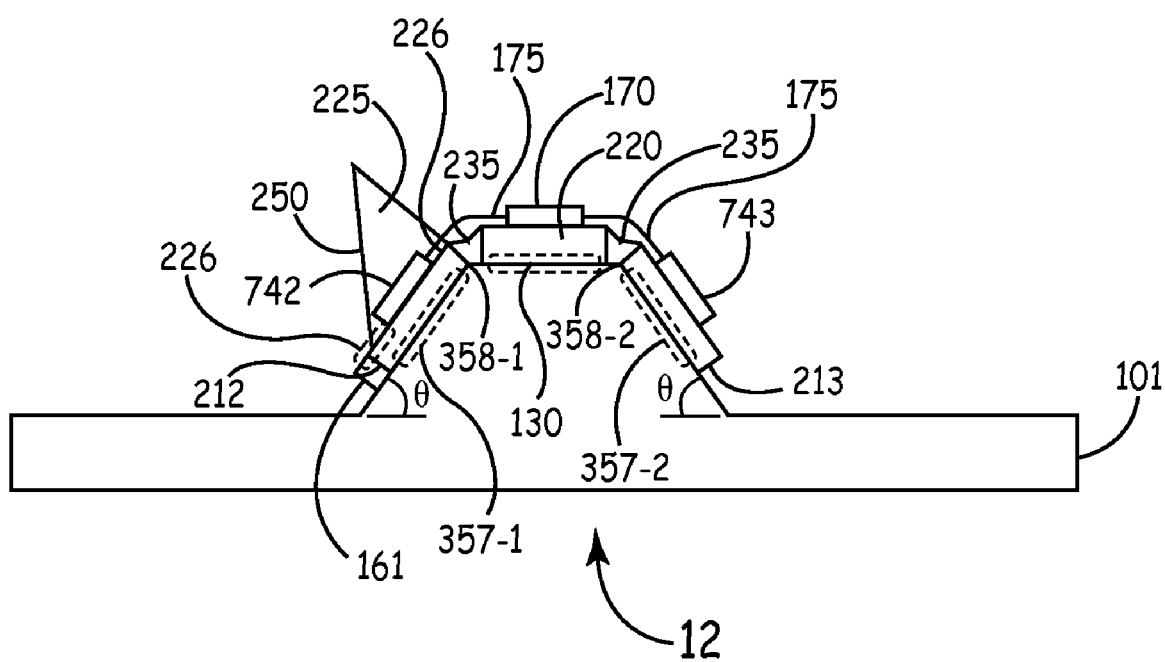

FIGS. 2A and 2B show an embodiment of a multi-axis sensor 12 in accordance with the present invention. FIG. 2A shows an oblique view of the multi-axis sensor 12. FIG. 2B shows a side view of the multi-axis sensor 12.

The multi-axis sensor 12 includes a substrate 101, and an anchor-region 220, three sensor-regions 210, two anchor-hinge-regions 230, a 180-degree-hinge region 225, and two 90-degree hinge regions 227. The anchor-region 220, the sensor-regions 210, the anchor-hinge-regions 230, the 180-degree-hinge region 225, and the two 90-degree hinge regions 227 are formed from a flexible material. The multi-axis sensor 10 also includes three oriented-sensor elements 741-743 that have three respective sensor axes 191-193 oriented in three different directions. The multi-axis sensor 12 also includes at least one bond pad 170 and trace lines 175.

The substrate 101 has two etched surfaces represented generally at 357-1 and 357-2. The first etched surface 357-1 shares a first edge 358-1 with the anchor surface 130. The second etched surface 357-2 shares a second edge 358-2 with the anchor surface 130. The first edge 358-1 opposes and is parallel to the second edge 358-2.

The first oriented-sensor element 741 has a first sense axis 191 in a first direction. The first oriented-sensor element 741 overlays the first sensor-region 211. The second oriented-sensor element 742 has a second sense axis 192 in a second direction. The second oriented-sensor element 742 overlays the second sensor-region 212. The second direction is orthogonal to the first direction. The first sensor-region 211 and the second sensor-region 212 overlay the first etched surface 357-1.

The third oriented-sensor element 143 has a sense axis 193 in a third direction. The third oriented-sensor element 143 overlays the third sensor-region 213 of the flexible material. The third sensor-region 213 overlays the second etched surface 357-2.

If the substrate is Silicon, the angles θ shown in FIG. 2B are equal to 54.74 degrees. In this case, the first etched surface 357-1 and the second etched surface 357-2 subtend a 70.52° angle. Since the first sense axis 191, the second sense axis 192, and the third sense axis 193 are oriented in different directions, the first oriented-sensor element 141, the second oriented-sensor element 142 and the third oriented-sensor element 143 are operable to sense in three orthogonal directions. The orthogonal components of the sensed fields are calculable using simple geometric factors.

If the substrate is etched so that the angles θ shown in FIG. 2B are equal to 45 degree, then the first etched surface 357-1 and the second etched surface 357-2 subtend a 90° angle, and the first sense axis 191, the second sense axis 192, and the third sense axis 193 are orthogonal to each other and the first oriented-sensor element 141, the second oriented-sensor element 142 and the third oriented-sensor element 143 are operable to sense in three orthogonal directions without using simple geometric factors.

The flexible material is patterned and etched along two boundaries between the 180-degree-hinge region 225 and the respective two non-contiguous sensor-regions 211 and 212 that form two 90-degree hinge regions 227. The 180-degree-hinge region 225 interfaces the first sensor-region 210 and the second sensor-region 211 by the 90-degree hinges 226. The 180-degree-hinge region 225 is folded along a diagonal-hinge 250. The bisected halves of the 180-degree-hinge region 225 extend perpendicularly from the first etched surface 357-1 and are positioned between the first sensor-region 211 and the second sensor-region 212.

As the 180-degree-hinge region 225 is folded along a diagonal-hinge 250, the two 90-degree hinges 226 are folded by 90° and rotated to be proximal to each other. In one implementation of this embodiment, the 90-degree hinges 226 are formed from the flexible material in 90-degree hinge regions 227 and from a second flexible material overlaying the etched and patterned 90-degree hinge regions 227. In one implementation of this latter embodiment, the flexible material from which the 90-degree hinge 226 is formed is a cured polyimide and the second flexible material is an uncured or partially cured polyimide.

At least one bond pad 170 for the electronic circuitry (not shown) to drive the multi-axis sensor 170 overlays the anchor-region 220 of flexible material. In one implementation of this embodiment, the electronic circuitry is on a separate chip. In another implementation of this embodiment, electronic circuitry is mounted on another section of the anchor region. The trace lines 175 and the at least one bond pad 170 communicatively couple the electronic circuitry to the first, second, and third oriented-sensor elements 741, 742, 743. The trace lines 175 overlay at least a portion of the hinge-regions of the flexible material. Specifically the trace lines 175 overlay the hinges 235 formed over the edges 358-1 and 358-2. A path 161 (FIGS. 2B and 4G) of flexible material forms a connection between the first sensor-region 211 and the second sensor-region 212. The trace lines 175 to connect the bond pad 170 to the first oriented-sensor element 741 extend from the bond pad 170 over the hinge 230 formed over the edge 358-1, over the second sensor-region 212, and over the path 161 to the first sensor region 211.

In one implementation of this embodiment, the first, second, and third oriented-sensor elements 741, 742, 743 in the multi-axis sensor 12 are tunneling magneto resistive (TMR) sensor elements 741, 742, 743.

Figure 3:
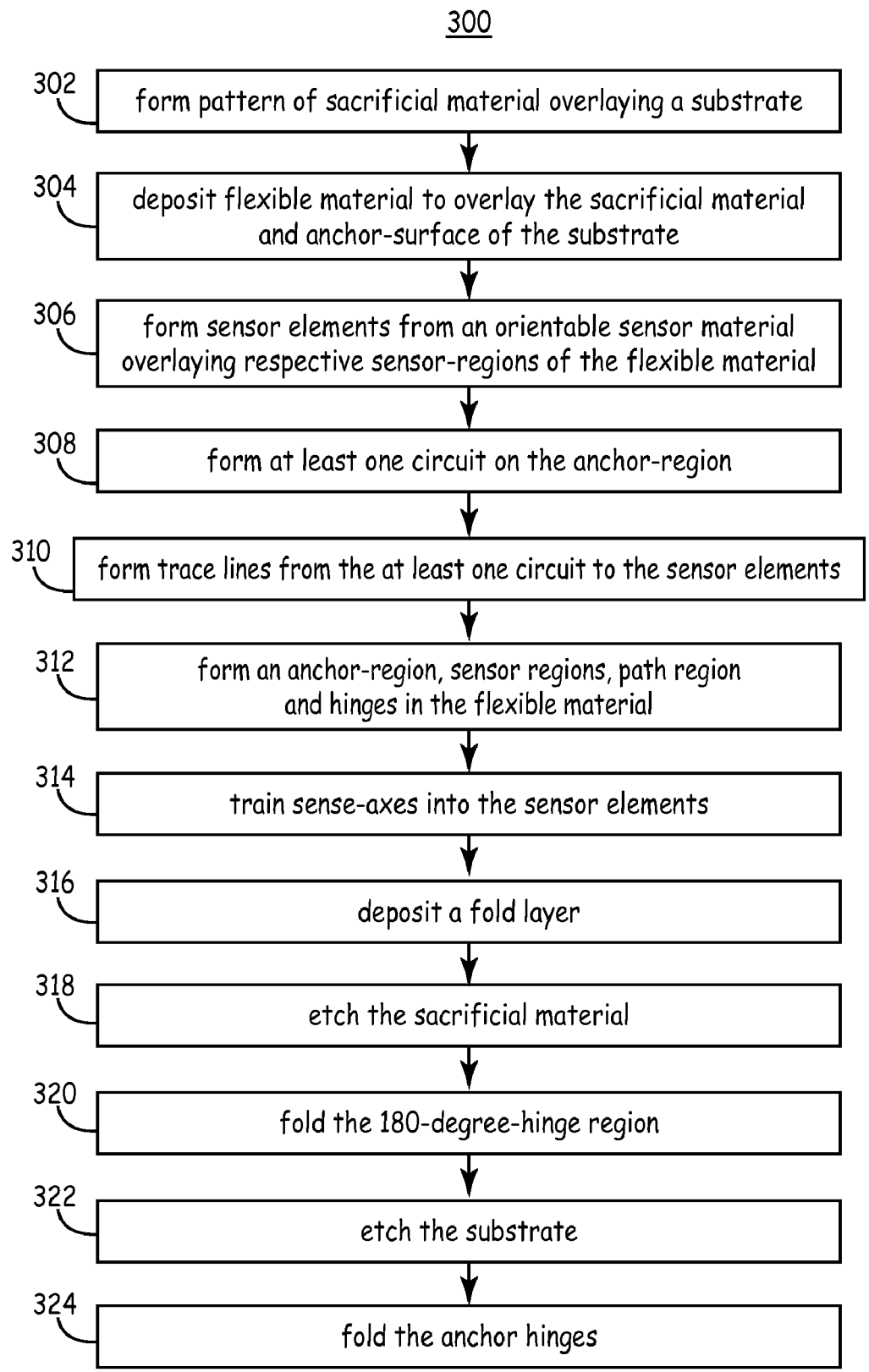
FIG. 3 is a flow diagram of an embodiment of a method to fabricate a multi-axis sensor in accordance with the present invention.
Figure 4A:
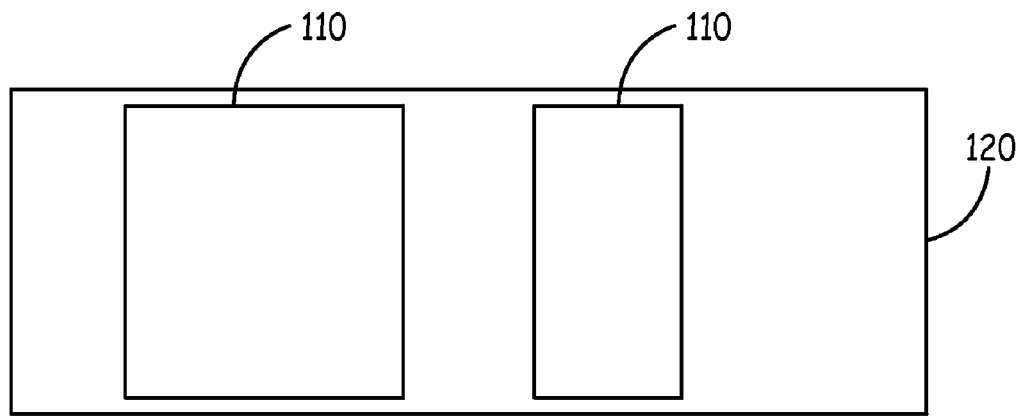
FIGS. 4A-4N are views of the substrate during various stages of processing to fabricate a multi-axis sensor in accordance with the present invention.
Figure 4B:
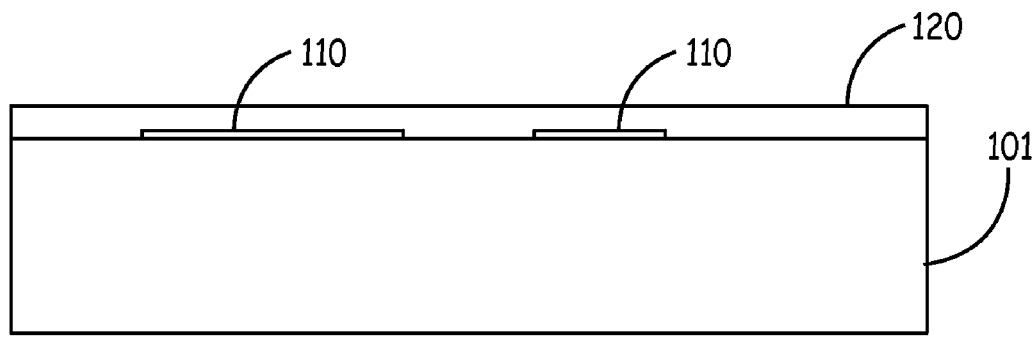
Figure 4C:
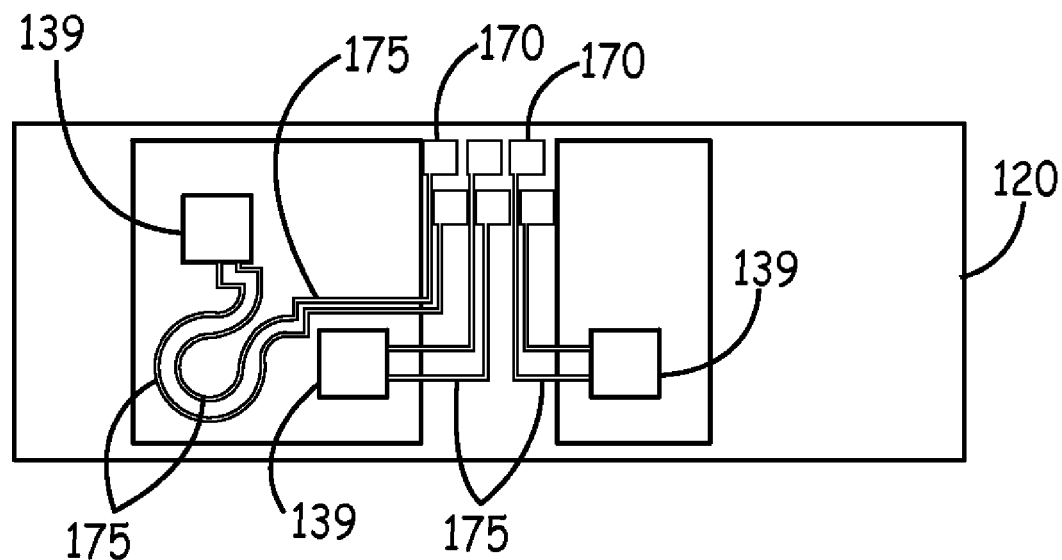
Figure 4D:
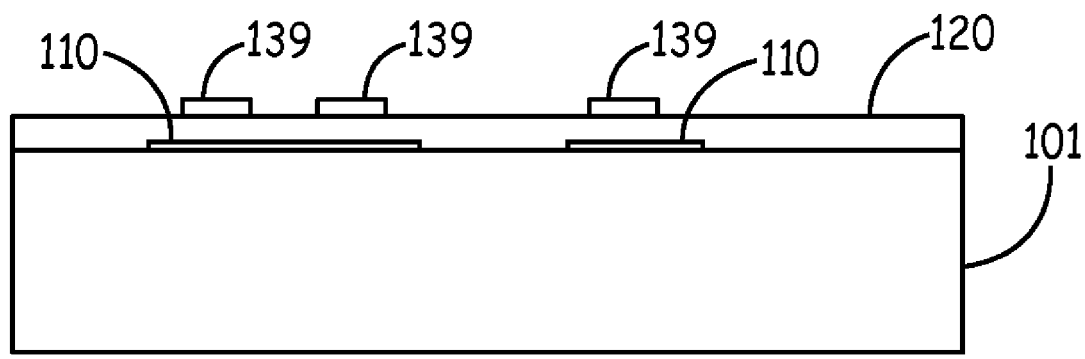
Figure 4E:
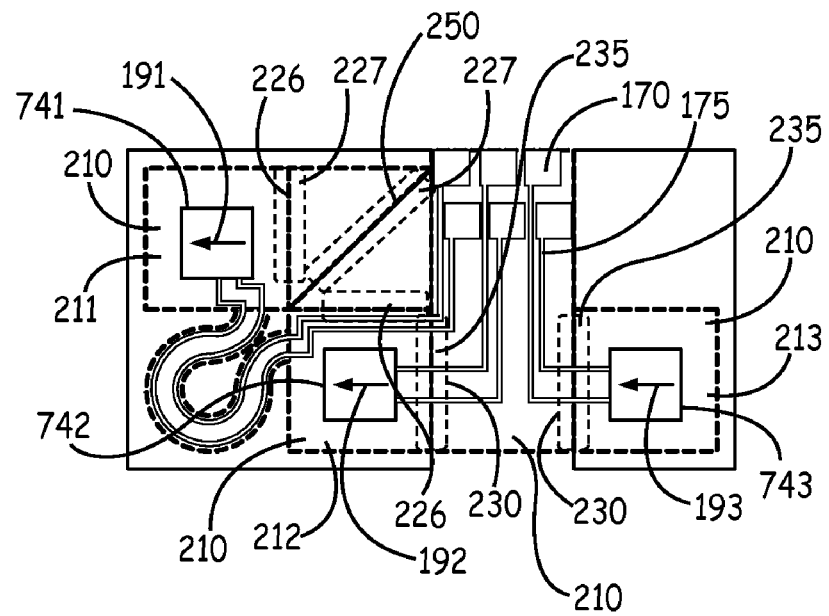
Figure 4F:
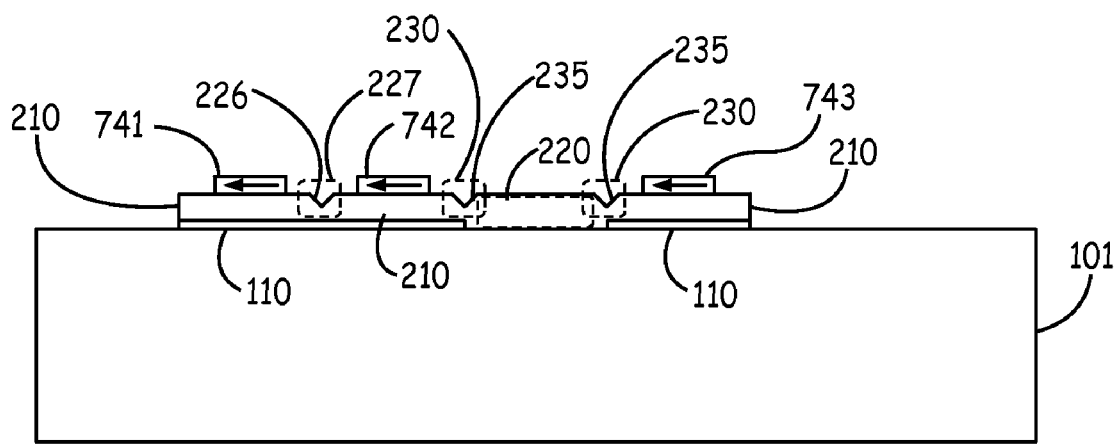
Figure 4G:
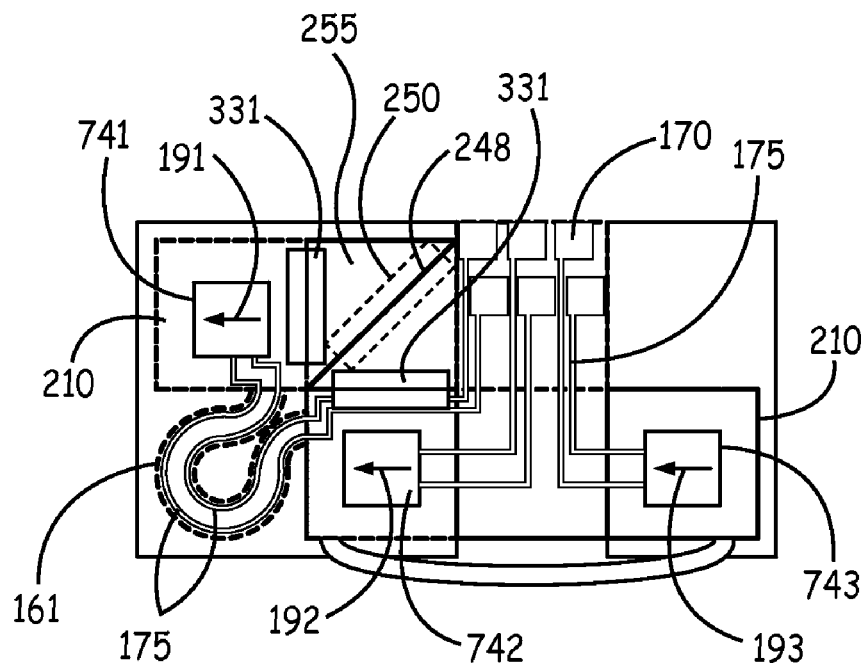
Figure 4H:
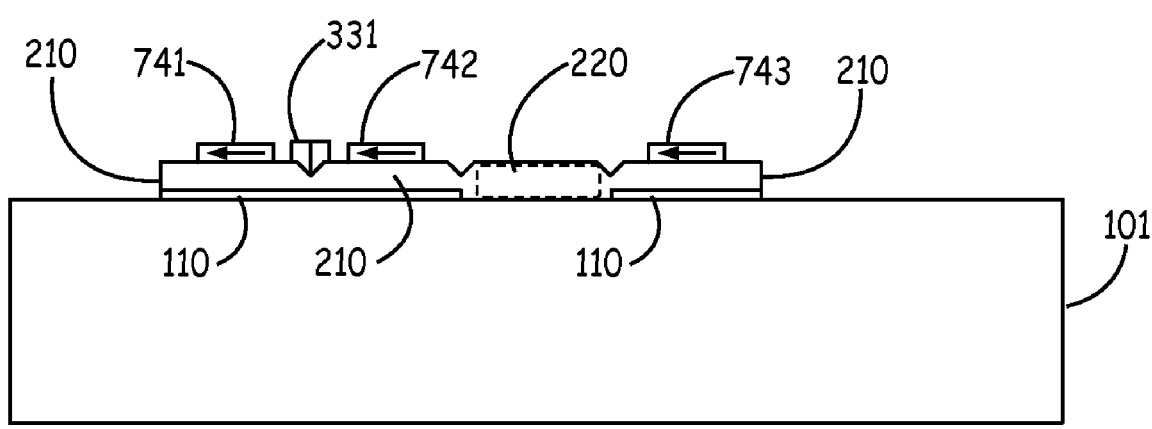
Figure 4I:
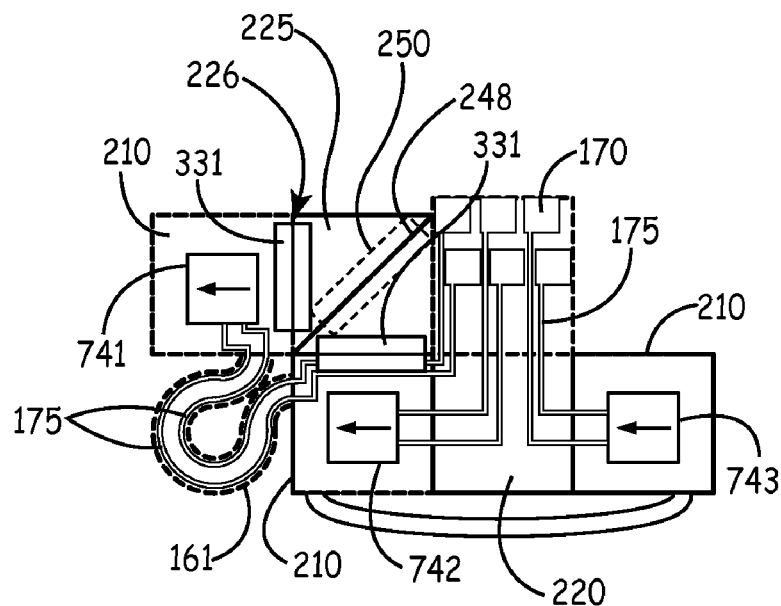
Figure 4J:
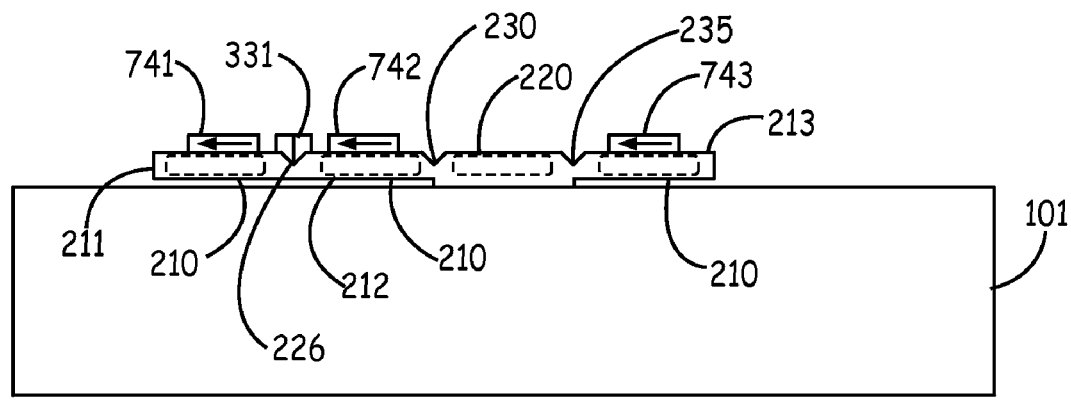
Figure 4K:
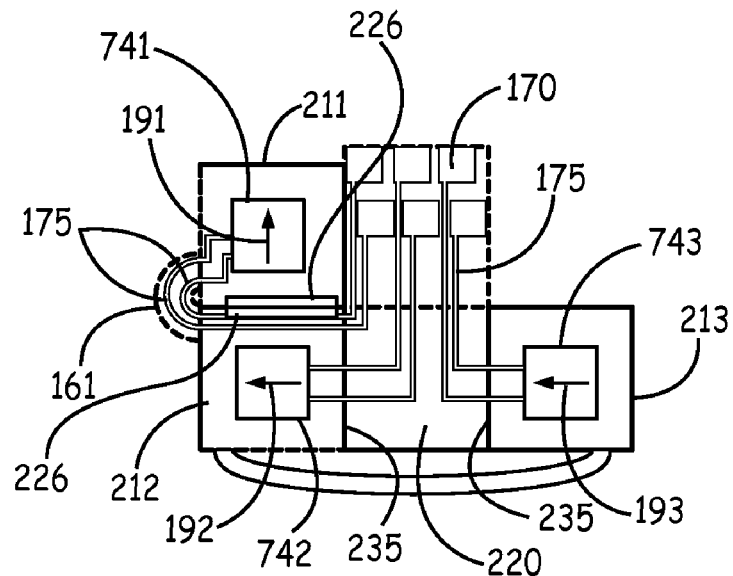
Figure 4L:
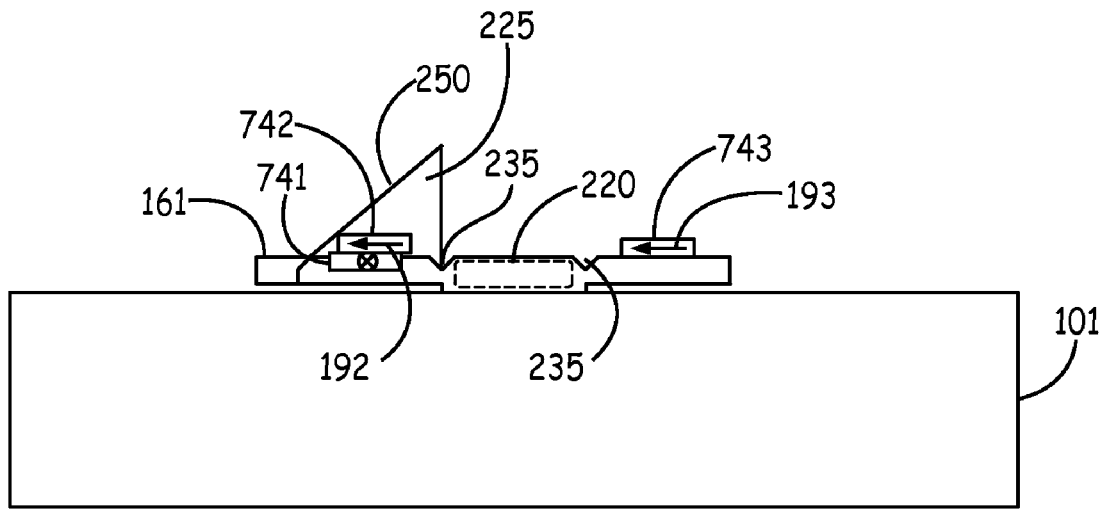
Figure 4M:
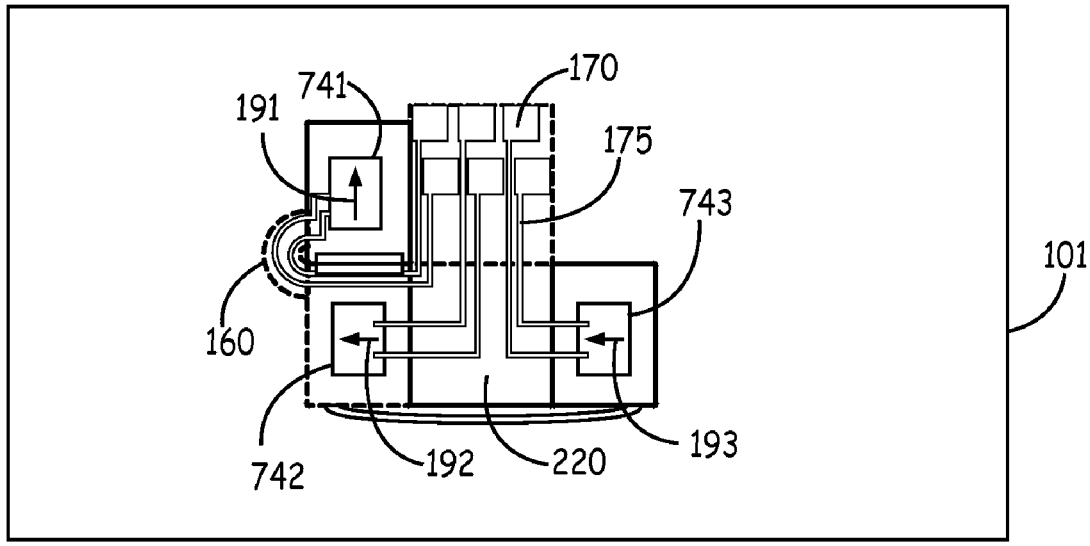
Figure 4N:
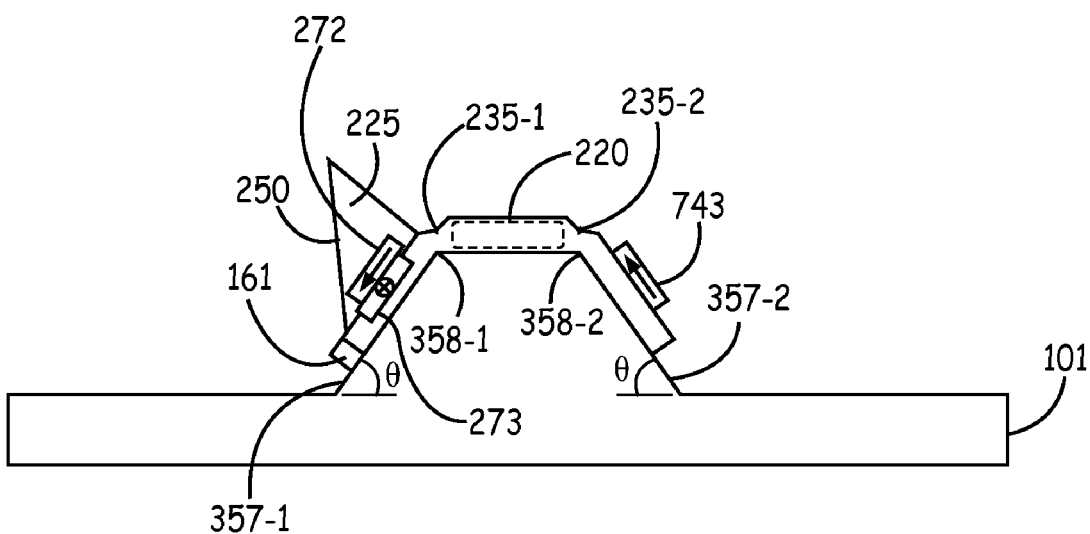

The method of fabricating the multi-axis sensor 10 is now described. FIG. 3 is a flow diagram of an embodiment of a method 300 to fabricate a multi-axis sensor 12 in accordance with the present invention. The fabrication process is described for the multi-axis sensor 12 (FIGS. 2A and 2B), which is the more complex process than the fabrication of the multi-axis sensor 10. FIGS. 4A-4N are views of the substrate 101 during various stages of processing to fabricate a multi-axis sensor 12 in accordance with the present invention. FIGS. 4A, 4C, 4E, 4G, 4I, 4K, and 4M are top views of the substrate 101 during the various stages of processing. FIGS. 4B, 4D, 4F, 4H, 4J, 4L, and 4N are side views of the substrate 101 during the various stages of processing. Some of the steps in method 300 are also used to fabricate the multi-axis sensor 10 (FIGS. 1A-1C). Those steps are pointed out during the description of those steps although the patterns etched in the deposited materials for the multi-axis sensor 10 differ from the patterns etched in the deposited materials for the multi-axis sensor 12 as is understandable to one skilled in the art upon reading this document.

The common steps to fabricate a multi-axis sensor 10 or 12 include: forming hinges in a flexible material overlaying a substrate; forming at least one bond pad on the flexible material; forming trace lines from the at least one circuit to the oriented-sensor elements; forming sensor elements from orientable sensor material overlaying respective sensor-regions of the flexible material; simultaneously training the sensor elements prior to etching a sacrificial layer to form a first, second, and third oriented-sensor element having a respective first, second, and third sense axis aligned in the same direction; etching sacrificial layers patterned under the flexible material; and etching the substrate at an angle from an anchor-surface of the substrate. The trace lines overlay at least a portion of the hinges formed in the flexible material. The first, the second, and the third sense axes are oriented in different directions so that the first, second, and third oriented-sensor element are operable to sense forces or fields in three orthogonal directions. Electronic circuitry is electrically connected, via the at least one bond pad 170 and the trace lines 175, to drive the oriented-sensor elements. In one implementation of this embodiment, only two oriented-sensor elements are formed.

The processes of method 300 are described for a single multi-axis sensor but it is to be understood that a plurality of multi-axis sensors are simultaneously formed on wafer, such as a silicon, GaAs, InP, or other semiconductor wafer. In one implementation of this embodiment, the multi-axis sensor is formed on a glass substrate. The orientable sensor material includes materials that form a sense axis when trained. In one implementation of this embodiment, the orientable sensor material is NiFe (Nickel-Iron), or alloys of NiFeCo (Nickel-Iron-Cobalt) in which the orientated sense axis is formed in the presence of a magnetic field. In another implementation of this embodiment, the orientable sensor material is a synthetic anti-ferromagnet (SAF), which is oriented by annealing in the presence of a magnetic field. SAF is deposited on top of a layer of normal antiferromagnet. Exemplary complexes of antiferromagnet/SAF include PtMn/CoFeB/Ru/CoFeB or IrMn/CoFeB/Ru/CoFeB, wherein, as is known in the art, PtMn is Platinum Manganese, IrMn is Iridium Manganese, CoFeB is Cobalt Iron Boron, and Ru is Ruthinium. In these latter embodiments, the CoFeB/Ru/CoFeB is the SAF complex.

At block 302, patterns of sacrificial material 110 are formed overlaying a substrate 101. This step is common to the multi-axis sensor 10 and the multi-axis sensor 12.

At block 304, a flexible material 120 is deposited to overlay the sacrificial material 110 and the anchor-surface 130 (FIGS. 2A and 2B) of the substrate 101. FIGS. 4A and 4B show top and side views, respectively, of the substrate 101 after blocks 302 and 304 are completed. In one implementation of this embodiment, the flexible material 120 is a polyimide that is deposited and cured. If the multi-axis sensor 10 is being fabricated, the flexible material 120 includes sensor-regions 210, an anchor-region 220, and at least one hinge-region 230. If the multi-axis sensor 12 is being fabricated, the flexible material 120 includes the anchor-region 220, the three sensor-regions 210, the two anchor-hinge-regions 230, the 180-degree-hinge region 225, the two 90-degree hinge regions 227, and a path region 160 (FIG. 4G).

At block 306, sensor elements 139 are formed from an orientable sensor material overlaying respective sensor-regions 210 of the flexible material 120. The sensor elements 139 are formed using techniques including, but not limited to, sputtering and patterning. FIGS. 4C and 4D show top and side views, respectively, of the substrate 101 after block 306 is completed.

At block 308, at least one bond pad 170 is formed on the anchor-region 220. The at least one bond pad 170 is to be connected to electronic circuitry that drives oriented-sensor elements 741-743. In one implementation of this embodiment, the electronic circuitry is mounted on another section of the anchor region that is not covered with the flexible material (not shown).

At block 310, trace lines 175 are formed from the at least one bond pad 170 to the sensor elements 139. The trace lines 175 overlay at least a portion of hinges (such as anchor hinges 235 formed in the flexible material 120. Thin polyimide connections (e.g., path 161 shown in FIG. 4G) can also be run from one sensor region 120 to another sensor region 120. The trace lines 175 are metal interconnect leads that bring power and input/output signals to the various oriented-sensor elements 741-743 via the hinges and the path 161.

At block 312, anchor-region 220, the three sensor-regions 210, the path 161, and hinges (e.g., the two anchor-hinge-regions 230, the 180-degree-hinge region 225, and the two 90-degree hinge regions 227) are formed in the flexible material 120. If the multi-axis sensor 10 is being fabricated, the sensor-regions 210 and the anchor-region 220, and anchor-hinges 235 are formed in the flexible material 120. Typically, the anchor-region 220, the three sensor-regions 210, a path 161, and hinges are formed by at least one patterning and at least one etching process.

The process of patterning and etching the two anchor-hinge-regions 230, the 180-degree-hinge region 225, and the two 90-degree hinge regions 227 in the flexible material 120 for the multi-axis sensor 12 is now described. The hinge-regions 230 of the flexible material 120 are patterned along the boundaries 280 between the anchor-region 220 and the adjacent sensor regions 212 and 213. A diagonal-hinge 250 is patterned across a diagonal 248 of the 180-degree-hinge region 225. Two hinge-regions 227 of the flexible material 120 along two boundaries 281 between the 180-degree-hinge region 225 and the respective two non-contiguous sensor-regions 211 and 212 are patterned for the 90-degree hinges 226. The locations for the hinges are created by, for example, etching perforated lines at the desired bending and/or folding locations. The perforation of the flexible material 120 makes the flexible material 120 less stiff in the hinge region. If the multi-axis sensor 10 is being fabricated, at block 312, anchor-hinges 235 (FIGS. 1A-1C) are patterned in the anchor-hinge-regions 230 of the flexible material 120.

The patterned hinge-regions 230 of flexible material 120 are etched to form the anchor-hinges 235 in the flexible material 120 along the boundaries 280 between the anchor-region 220 and the adjacent sensor regions 212 and 213. The patterned diagonal-hinge region 225 is etched to form a diagonal-hinge 250. The two patterned hinge-regions 227 are etched to form two 90-degree hinges 226.

At block 314, the sensor elements 139 are trained to form oriented-sensor elements 140 that are oriented in the same direction. The sensor elements 139 are trained, using standard techniques, to produce preferred axes, while the sensor elements 139 lie in a common plane of the substrate 101. The trained sensor elements 139 are referred to herein as oriented-sensor elements 741, 742, or 743, which have the same preferred axis at this point of the processing. The arrows in the oriented-sensor elements 741, 742, or 743 are indicative of the orientation of the sense axes 191-193. FIGS. 4E and 4F show top and side views, respectively, of the substrate 101 after blocks 308-318 are completed. In one implementation of this embodiment, the sensors are trained before the patterning and etching of the hinges. In this embodiment, block 314 is completed prior to block 308.

At block 316, a fold layer 331 is deposited and patterned over the two 90-degree hinge region 227. In one implementation of this embodiment, the two 90-degree hinges 226 are formed from a cured polyimide and the fold layer 331 is formed from an uncured or a partially cured polyimide. This exemplary layer structure enhances the folding-upward of the two 90-degree hinges 226. FIGS. 4G and 4H show top and side views, respectively, of the substrate 101 after block 312 is completed. In one implementation of this embodiment, block 316 is not implemented in method 300.

At block 318, the sacrificial material 110 is etched using standard etching technologies. FIGS. 4I and 4J show top and side views, respectively, of the substrate 101 after block 314 is completed.

At block 320, the 180-degree-hinge region 225 is folded along the diagonal-hinge 250. While folding the 180-degree-hinge region 225 along the diagonal-hinge 250, the two segments of the bisected 180-degree-hinge region 225 are rotated about the 90-degree hinges 226. When this step is completed, the first oriented-sensor element 741 on the first sensor-region 211 is rotated in the plane of the substrate 101 by 90° with respect to the second oriented-sensor element 142 on the second sensor-region 212. In this manner, the sensor-axis 191 of the first oriented-sensor element 741 is orthogonal to the sensor-axis 192 of the second oriented-sensor element 142. FIGS. 4K and 4L show top and side views, respectively, of the substrate 101 after block 320 is completed.

In one implementation of this embodiment, the 180-degree-hinge region 225 is folded using air jets. After fabrication, a jet of air is aimed at the diagonal-hinge 250 from an appropriate direction. The blast lifts the flex circuit at the diagonal-hinge 250.

After folding the flex circuit is held in place. This is done, for example, by depositing a polymer (including, but not limited to, parylene and photoresist) onto the folded structure. "Latching" features could also be patterned into the flex circuit so that it locks in place automatically after folding.

At block 322, the substrate 101 is etched at an angle from the anchor-surface 130. At block 324, the anchor-hinges 235 in the flexible material 120 are folded so that the sensor regions 212 and 213 that are adjacent to the anchor-region 220 overlay the respective surfaces 357-1 and 357-2 of the etched substrate 101. Specifically, the first anchor hinge 235-1 connecting the second sensor-region 212 to the anchor-region 220 at a first edge 358-1 of the anchor-surface 130 is folded so that the sensor region 212 overlays the surface 357-1 of the etched substrate 101. The second anchor hinge 235-2 connecting a third sensor-region 213 to the anchor-region 220 at a second edge 358-2 of the anchor-surface 130 is folded so that the third sensor region 213 overlays the surface 357-2 of the etched substrate 101. The third oriented-sensor element 743 overlays the third sensor-region 213.

Since the sensor regions 211 and 212 are in the same plane, the sensor region 211 also overlays the surface 357-1 of the etched substrate 101. Since the first oriented-sensor element 741 and the second oriented-sensor element 742 overlay the respective sensor regions 211 and 212, the first oriented-sensor element 741 and the second oriented-sensor element 742 are angularly oriented to the anchor-region 220. Since the third oriented-sensor element 742 overlays the sensor region 213, the third oriented-sensor element 743 is angularly oriented to the anchor-region 220.

In this manner, the first, second, and third oriented-sensor elements 741-743 are arranged with the sense axes 191-193 in different orientations. The orthogonal components of the sensed fields are calculable using simple geometric factors. In an embodiment in which the etched surfaces 357-1 and 357-2 subtend a 90° angle, the first, second, and third oriented-sensor elements 741-743 are arranged with the sense axes 191-193 operable to sense in three orthogonal directions and there is no need to use simple geometric factors.

In one implementation of this embodiment, one or more latching features are formed in the hinge-region 235 to hold one or more of the sensor regions 211-213 in place against the etched surfaces 357-1 and 357-2.

It is to be understood that the order of the steps (blocks) in method 300 can be re-arranged based on the type of materials being processed, the number and types of sensor elements, and the number and types of hinges. The folding and locking steps can be done on the wafer, or during packaging of the multi-axis sensor. If done during packaging, the packaging material itself (usually a polymer) can be used to permanently hold the folded multi-axis sensor in place.

Thus, the method 300 is used to build a "flexible circuit on a chip," by fabricating sensors on the flex circuit, with each sensor having the same orientation, then folding and "clamping" the flexible circuit over an etched substrate so that the oriented-sensor elements 741-743 have different orientations, which are able to sense fields or forces in three orthogonal directions.

Although specific embodiments have been illustrated and described herein, it will be appreciated by those skilled in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method of fabricating a multi-axis sensor, the method comprising:
    forming patterns of sacrificial material overlaying a substrate;
    overlaying a flexible material on the sacrificial material and an anchor-surface of the substrate, the flexible material including sensor-regions, an anchor-region, and at least one hinge-region;
    forming sensor elements from orientable sensor material overlaying respective sensor-regions of the flexible material;
    forming at least one respective anchor-hinge in the flexible material along the boundary between the anchor-region and an adjacent sensor region;
    forming the sensor-regions, the anchor-region, and the at least one hinge-region in the flexible material;
    training the sensor elements to form respective oriented-sensor elements that are oriented in the same direction;
    etching the sacrificial material; and
    etching the substrate at an angle from the anchor-surface.

2. The method of claim 1, further comprising:
    folding the at least one anchor-hinge in the flexible material, wherein the sensor region adjacent to the anchor-region overlays at least a portion of the etched substrate, wherein said sensor region is angularly oriented to the anchor-region.

3. The method of claim 2, further comprising:
    forming a sensor element from orientable sensor material overlaying the anchor-region of the flexible material; and
    training the sensor element overlaying the anchor-region of the flexible material while training the sensor elements overlaying the respective sensor-regions of the flexible material, wherein the sensor region adjacent to the anchor-region overlays the etched substrate, and wherein the oriented-sensor element on the sensor region is angularly oriented to the oriented-sensor element on the anchor-region.

4. The method of claim 1, wherein the flexible material further includes a 180-degree-hinge region bordering two non-contiguous sensor-regions, the method further comprising:
    patterning a diagonal-hinge across a diagonal of the 180-degree-hinge region; and
    patterning two hinge-regions of the flexible material along two boundaries between the respective two non-contiguous sensor-regions and the 180-degree-hinge region;
    etching the patterned diagonal-hinge to form a diagonal-hinge; and
    etching the two patterned hinge-regions to form two 90-degree hinges.

5. The method of claim 4, further comprising forming a fold layer over the two 90-degree hinges.

6. The method of claim 4, further comprising:
    folding the 180-degree-hinge region along the diagonal-hinge; and
    rotating the 180-degree-hinge region about the 90-degree hinges while folding the 180-degree-hinge region along the diagonal-hinge, wherein a first oriented-sensor element on a first sensor-region is rotated in the plane of the substrate by ninety degrees with respect to a second oriented-sensor element on a second sensor-region, wherein a sensor-axis of the first oriented-sensor element is orthogonal to a sensor-axis of the second oriented-sensor element.

7. The method of claim 6, wherein etching the substrate at an angle from the anchor-surface comprises etching the substrate at a 54 degree angle from opposing edges of the anchor-surface.

8. The method of claim 6, wherein forming at least one respective anchor-hinge in the flexible material comprises forming a first and second anchor-hinge, the method further comprising:
    folding the first anchor hinge connecting the second sensor-region to the anchor-region at a first edge of the anchor-surface, wherein first and second sensor regions overlay the first etched surface of the etched substrate; and
    folding the second anchor hinge connecting a third sensor-region to the anchor-region at a second edge of the anchor-surface, wherein a third oriented-sensor element overlaying the third sensor-region overlays the etched surface of the etched substrate, and wherein the second edge of the anchor-surface opposes the first edge of the anchor-surface.

9. The method of claim 1, further comprising:
    forming at least one bond pad on the anchor-region; and
    forming trace lines from the bond pad the sensor elements, wherein the trace lines overlay at least a portion of hinges formed in the flexible material.

10. The method of claim 9, wherein the flexible material further includes a 180-degree-hinge region bordering two non-contiguous sensor-regions, the method further comprising:
    forming at least one path of flexible material, the at least one path connecting a first sensor-region supporting a first oriented-sensor element to a second sensor region supporting a second oriented-sensor element;
    forming at least one trace line from the at least one bond pad to the first oriented-sensor element via the second sensor region and the at least one path.

11. The method of claim 1, further comprising forming at least one latching feature in the at least one hinge-region.

12. A multi-axis sensor, comprising:
    an anchor surface of a substrate;

an anchor-region of flexible material, wherein the anchor-region is attached the anchor surface of the substrate;

at least one etched surface of the substrate, the etched surface sharing at least one edge with the anchor surface;

at least one sensor-region of the flexible material rotatably attached to the anchor-region of the flexible material by at least one hinge formed in at least one hinge-region of the flexible material, the hinge-region overlying the edge shared by the least one etched surface of the substrate and the anchor surface of the substrate; and at least two oriented-sensor elements having at least two respective sensor axes oriented in at least two different directions.

13. The multi-axis sensor of claim 12, wherein the at least one etched surface of the substrate includes at least a first etched surface and a second etched surface sharing at least a first edge and a second edge, respectively, with the anchor surface.

14. The multi-axis sensor of claim 13, wherein the at least two oriented-sensor elements having the at least two respective sensor axes oriented in at least two different directions comprise:

a first oriented-sensor element having a first sense axis in a first direction, the first oriented-sensor element overlaying a first sensor-region of the flexible material; and a second oriented-sensor element having a second sense axis in a second direction, the second oriented-sensor element overlaying a second sensor-region of the flexible material; and a third oriented-sensor element having a third sense axis in a third direction, the third oriented-sensor element overlaying the anchor-region of flexible material, wherein the first sense axis, the second sense axis, and the third sense axis have components in three orthogonal directions, wherein the first, second, and third oriented-sensor elements are operable to sense in three orthogonal directions.

15. The multi-axis sensor of claim 13, further comprising:

180-degree-hinge region folded along a diagonal-hinge, the 180-degree-hinge region interfaced to a first sensor-region and a second sensor-region by 90-degree hinges;

a first oriented-sensor element having a first sense axis in a first direction, the first oriented-sensor element overlaying the first sensor-region; and a second oriented-sensor element having a second sense axis in a second direction, the second oriented-sensor element overlaying the second sensor-region, wherein the second direction is orthogonal to the first direction, and wherein the first sensor-region and the second sensor-region overlay the first etched surface.

16. The multi-axis sensor of claim 15, wherein the first etched surface shares the first edge with the anchor surface and the second etched surface shares the second edge with the anchor surface, wherein the first edge opposes the second edge, the multi-axis sensor further comprising:

a third oriented-sensor element having a third sense axis in a third direction, the third oriented-sensor element overlaying a third sensor-region of flexible material that overlays the second etched surface, wherein the first, second, and third oriented-sensor elements are operable to sense in three orthogonal directions.

17. The multi-axis sensor of claim 12, further comprising;

at least one bond pad overlaying the anchor-region of flexible material; and trace lines communicatively coupling the at least one bond pad to the at least two oriented-sensor elements, wherein the trace lines overlay at least a portion of the hinge-regions of the flexible material.

18. The multi-axis sensor of claim 15, wherein first, second, and third oriented-sensor elements are tunneling magneto resistive (TMR) sensor elements, and wherein the flexible material is a polyimide.

19. A method of fabricating a multi-axis sensor, the method comprising:

forming hinges in a flexible material overlaying a substrate;

forming sensor elements from orientable sensor material overlaying respective sensor-regions of the flexible material;

simultaneously training the sensor elements prior to etching a sacrificial layer patterned under the flexible material to form a first oriented-sensor element, a second oriented-sensor element, and a third oriented-sensor element having a first sense axis, a second sense axis, and a third sense axis, respectively, aligned in the same direction;

etching the substrate at an angle from an anchor-surface of the substrate; and folding the flexible material containing the sensor elements onto the etched substrate surfaces, wherein the first sense axis, the second sense axis, and the third sense axis are oriented in different directions, wherein the first, second, and third oriented-sensor elements are operable to sense in three orthogonal directions.

20. The method of claim 19, further comprising:

forming at least one bond pad on the flexible material; and forming trace lines from the at least one bond pad to the first, the second, and the third oriented-sensor elements, wherein the trace lines overlay at least a portion of the hinges formed in the flexible material.

* * * * *